(12) United States Patent
Matsuda et al.

(10) Patent No.: US 12,074,262 B2
(45) Date of Patent: Aug. 27, 2024

(54) LIGHT-EMITTING DEVICE

(71) Applicant: NICHIA CORPORATION, Anan (JP)

(72) Inventors: Kazuya Matsuda, Anan (JP); Atsushi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 440 days.

(21) Appl. No.: 17/489,475

(22) Filed: Sep. 29, 2021

(65) Prior Publication Data
US 2022/0102596 A1 Mar. 31, 2022

(30) Foreign Application Priority Data

Sep. 30, 2020 (JP) .................................. 2020-164792

(51) Int. Cl.
*H01L 33/50* (2010.01)
*H01L 33/54* (2010.01)
*H01L 33/62* (2010.01)

(52) U.S. Cl.
CPC .......... *H01L 33/504* (2013.01); *H01L 33/507* (2013.01); *H01L 33/54* (2013.01); *H01L 33/62* (2013.01)

(58) Field of Classification Search
CPC ........... H01L 33/50–508; H01L 33/504; H01L 25/0753
See application file for complete search history.

(56) References Cited

U.S. PATENT DOCUMENTS

| | | | |
|---|---|---|---|
| 2006/0083281 A1 | 4/2006 | Inoguchi | |
| 2011/0215349 A1 | 9/2011 | An et al. | |
| 2014/0319553 A1* | 10/2014 | Ye | G02B 5/283 |
| | | | 257/89 |
| 2014/0339495 A1* | 11/2014 | Bibl | H01L 33/502 |
| | | | 257/13 |
| 2018/0069162 A1 | 3/2018 | Abe et al. | |
| 2019/0103525 A1 | 4/2019 | Bando et al. | |
| 2019/0334063 A1 | 10/2019 | Kim et al. | |

(Continued)

FOREIGN PATENT DOCUMENTS

| | | |
|---|---|---|
| JP | 2006-114854 A | 4/2006 |
| JP | 2011-249807 A | 12/2011 |

(Continued)

*Primary Examiner* — Evan G Clinton
(74) *Attorney, Agent, or Firm* — Foley & Lardner LLP

(57) ABSTRACT

A light-emitting device includes: a first light-emitting element and a second light-emitting element, each configured to be independently driven; a wall portion located between the first light-emitting element and the second light-emitting element; a first light-transmissive member separated from the second light-emitting element by the wall portion and covering at least a portion of lateral surfaces of the first light-emitting element, wherein the first light-transmissive member contains a first wavelength converting member; and a second light-transmissive member covering the first light-emitting element, the second light-emitting element, and the first light-transmissive member in a plan view, wherein the second light-transmissive member contains a second wavelength converting member. A peak emission wavelength of the first wavelength converting member is longer than a peak emission wavelength of the second wavelength converting member.

20 Claims, 7 Drawing Sheets

(56) References Cited

U.S. PATENT DOCUMENTS

2019/0371981 A1    12/2019  Bando
2021/0341653 A1*   11/2021  Wang .................... H01L 27/156

FOREIGN PATENT DOCUMENTS

| JP | 2012-199539 A | 10/2012 | | |
|---|---|---|---|---|
| JP | 2018-041843 A | 3/2018 | | |
| JP | 2019-212699 A | 12/2019 | | |
| JP | 2020-017711 A | 1/2020 | | |
| WO | WO-2012/121304 A1 | 9/2012 | | |
| WO | WO-2012121304 A1 * | 9/2012 | ......... | H01L 25/0753 |

* cited by examiner

LIGHT-EMITTING DEVICE

CROSS-REFERENCE TO RELATED PATENT APPLICATION

The present application claims priority under 35 U.S.C. § 119 to Japanese Patent Application No. 2020-164792, filed on Sep. 30, 2020, the contents of which are hereby incorporated by reference in their entirety.

BACKGROUND

The present disclosure relates to a light-emitting device.

Generally, light-emitting devices that include light-emitting elements such as light emitting diodes have been utilized widely as various light sources of various luminaire. For example, JP-A 2020-17711 describes a light-emitting device including a first light-emitting element and a second light-emitting element, a first light-transmissive member disposed on an upper surface of the first light-emitting element and containing a first fluorescent material, a second light-transmissive member disposed on an upper surface of the second light-emitting element, and a sealing member covering the first light-transmissive member and the second light-transmissive member and containing a third fluorescent material. The chromaticity of light emitted from the first light-transmissive member and the chromaticity of light emitted from the second light-transmissive member are different from each other.

SUMMARY

An object of certain embodiments according to the present disclosure is to provide a light-emitting device configured to emit light in a wide range of chromaticity.

A light-emitting device according to one embodiment includes a first light-emitting element and a second light-emitting element, each configured to be independently driven; a wall portion located between the first light-emitting element and the second light-emitting element; a first light-transmissive member separated from the second light-emitting element by the wall portion and covering at least a portion of lateral surfaces of the first light-emitting element, and containing a first wavelength converting member; and a second light-transmissive member covering the first light-emitting element, the second light-emitting element, and the first light-transmissive member in a plan view, and containing a second wavelength converting member; in which a peak emission wavelength of the first wavelength converting member is longer than a peak emission wavelength of the second wavelength converting member.

According to certain embodiments, a light-emitting device of luminous efficiency and high color rendering properties can be provided.

DETAILED DESCRIPTION

In the following, certain embodiments will be described with reference to the drawings. The embodiments shown below are to exemplify a light-emitting device to give a concrete form to technical ideas of the present embodiments, and the scope of the invention is not limited to those embodiments described below. In particular, the sizes, materials, shapes and the relative positions of the members described with respect to the embodiments are given as examples and not as limitations to the scope of the invention, unless specifically stated. In order to avoid excessively complicating drawings, one or more members may not be shown in some drawings. The sizes and the positional relationships of the members in each of the drawings are occasionally shown exaggerated for ease of explanation. In the embodiments, the expression "covering" includes not only a state of direct contact but also a state of indirect contact, for example, via another member.

Embodiments

Figure 1A:
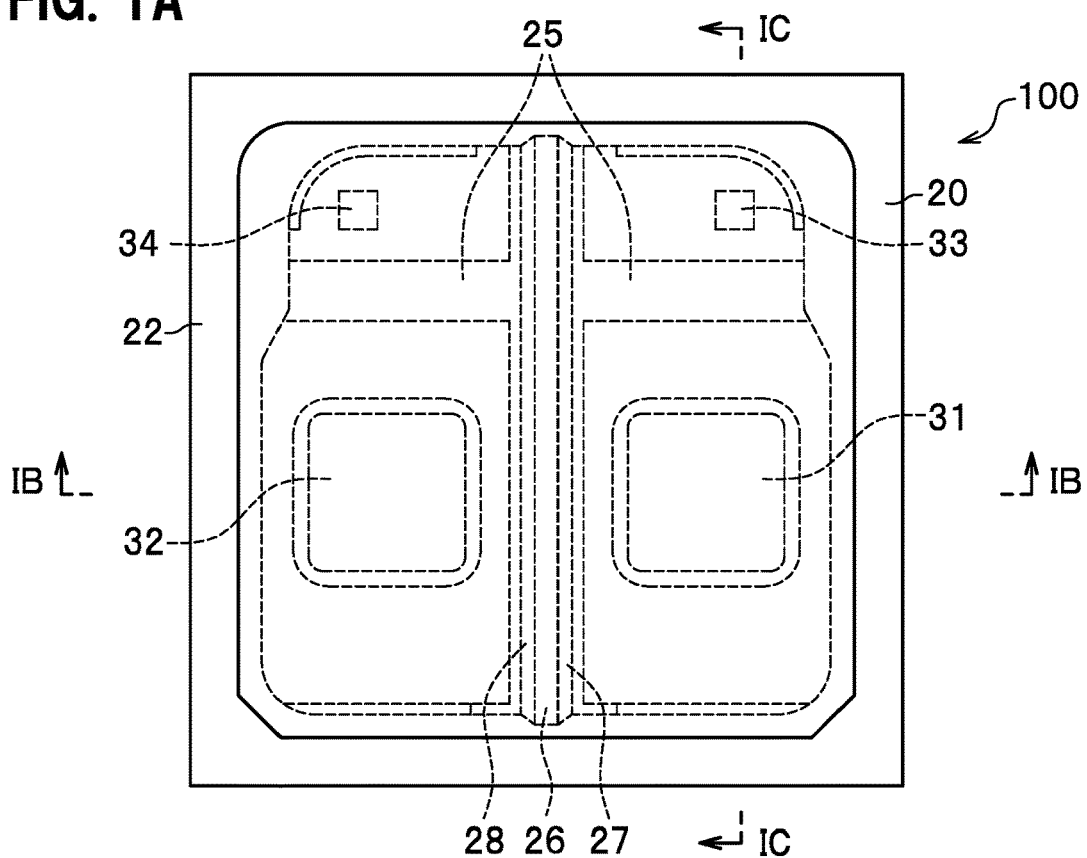
FIG. 1A is a plan view schematically showing an example of a configuration of a light-emitting device according to one embodiment.
Figure 1B:
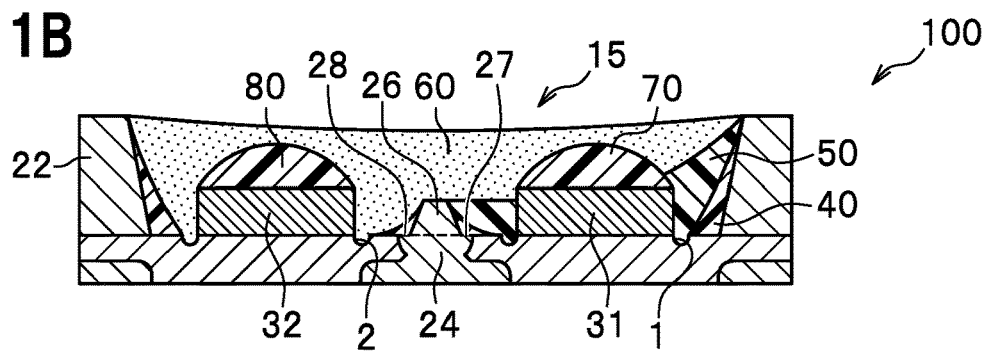
FIG. 1B is a schematic cross-sectional view taken along line IB-IB of FIG. 1A.
Figure 1C:
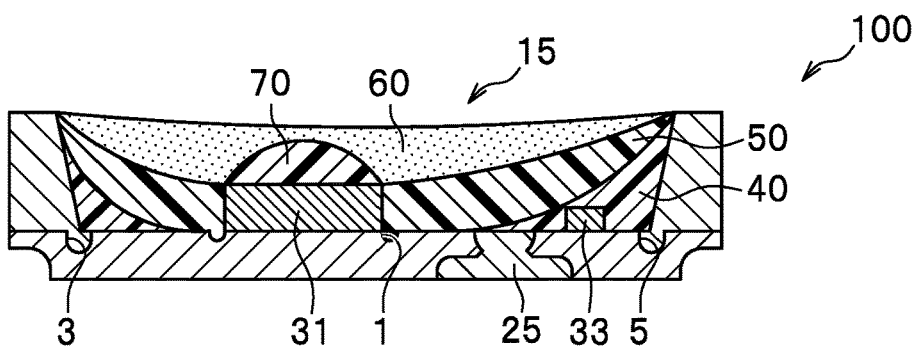
FIG. 1C is a schematic cross-sectional view taken along line IC-IC of FIG. 1C.
Figure 1D:
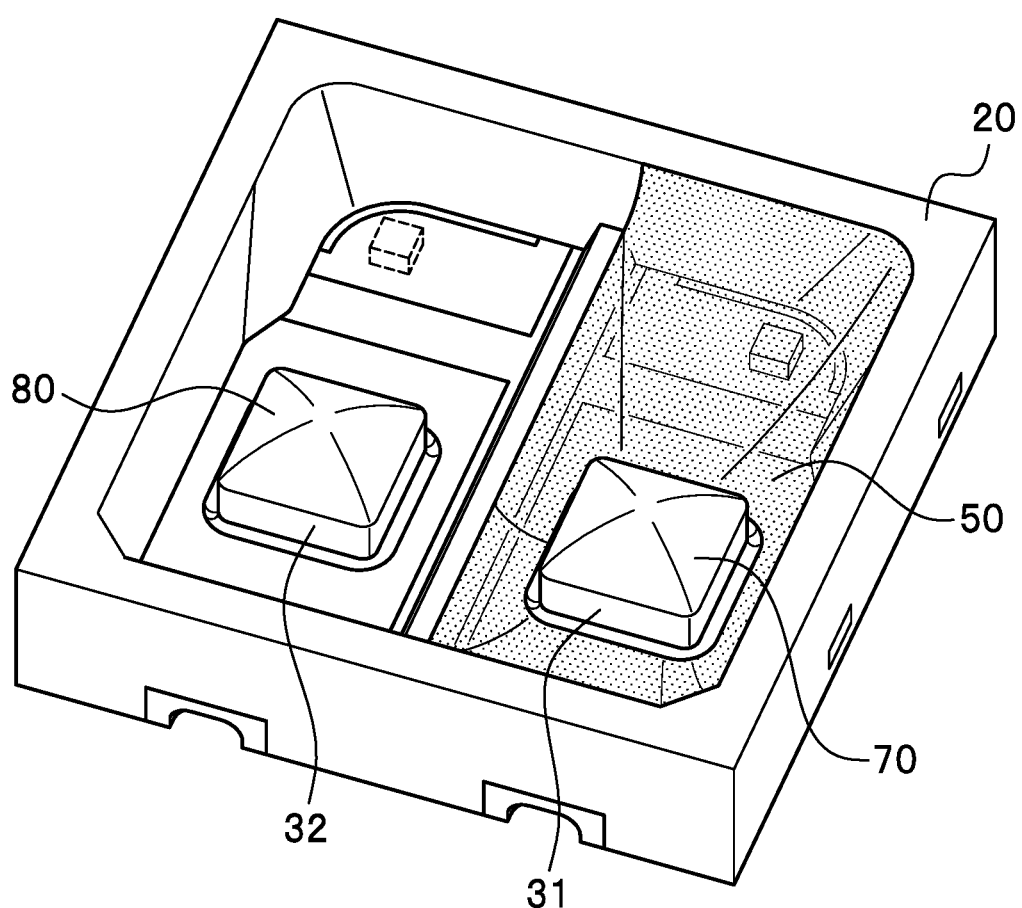
FIG. 1D is a perspective view schematically showing an arrangement of a first light-transmissive member according to one embodiment.

A light-emitting device 100 according to one embodiment will be described below with reference to FIG. 1A to FIG. 4C. In FIG. 1A, some components, such as a first light-transmissive member 50, are not shown for ease of understanding.

A light-emitting device 100 includes a first light-emitting element 31 and a second light-emitting element 32, each configured to be independently driven, a wall portion 26 located between the first light-emitting element 31 and the second light-emitting element 32, a first light-transmissive member 50 separated from the second light-emitting element 32 by the wall portion 26, covering at least a portion of lateral surfaces of the first light-emitting element 31 and containing a first wavelength converting member, and a second light-transmissive member 60 covering the first light-emitting element 31, the second light-emitting element 32, and the first light-transmissive member 50 in a plan view and containing a second wavelength converting member. A peak emission wavelength of the first wavelength converting member is longer than a peak emission wavelength of the second wavelength converting member.

The light-emitting device 100 includes a package 20, the first light-emitting element 31, the second light-emitting element 32, a first protective element 33, a second protective element 34, a light reflecting member 40, the first light-transmissive member 50, the second light-transmissive member 60, a third light-transmissive member 70, and a fourth light-transmissive member 80.

Each component of the light-emitting device 100 will be described below.

Package

Figure 2A:
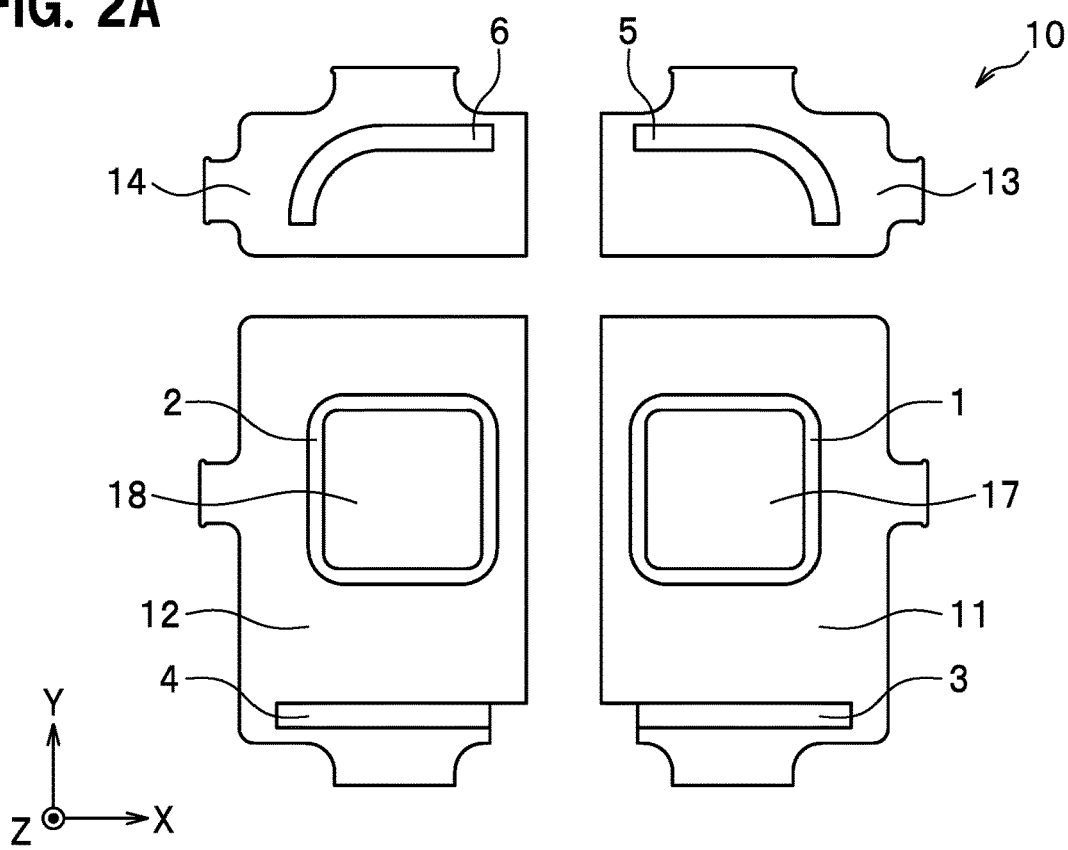
FIG. 2A is a plan view schematically showing an example of a lead frame of a light-emitting device according to one embodiment.
Figure 2B:
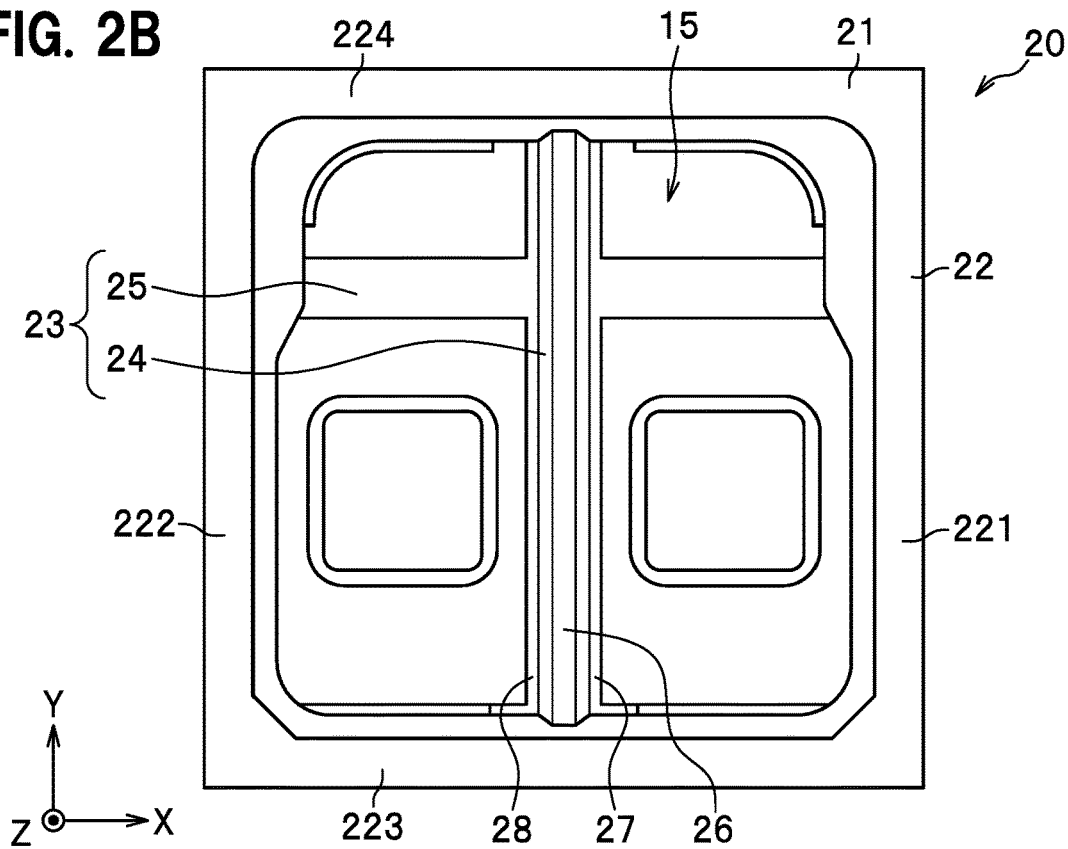
FIG. 2B is a plan view schematically showing an example of a package for a light-emitting device according to one embodiment.
Figure 3A:
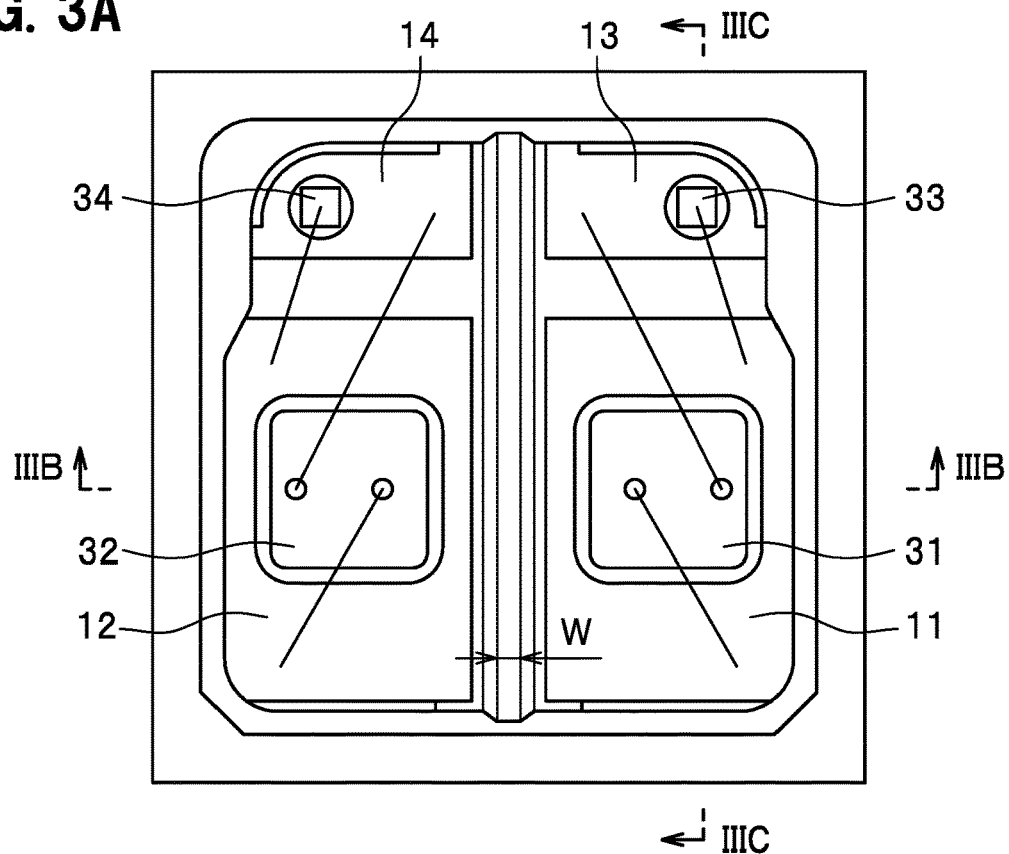
FIG. 3A is a plan view schematically showing an example of arrangement of light-emitting elements etc., disposed in a light-emitting device.
Figure 3B:
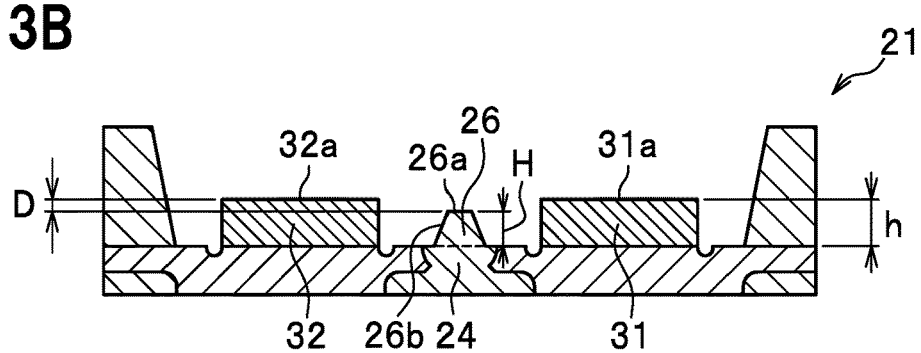
FIG. 3B is a schematic cross-sectional view taken along line IIIB-IIIB of FIG. 3A.
Figure 3C:
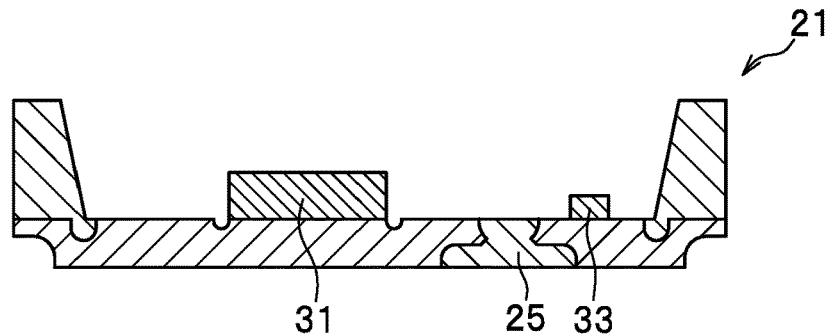
FIG. 3C is a schematic cross-sectional view taken along line IIIC-IIIC of FIG. 3A.
Figure 4A:
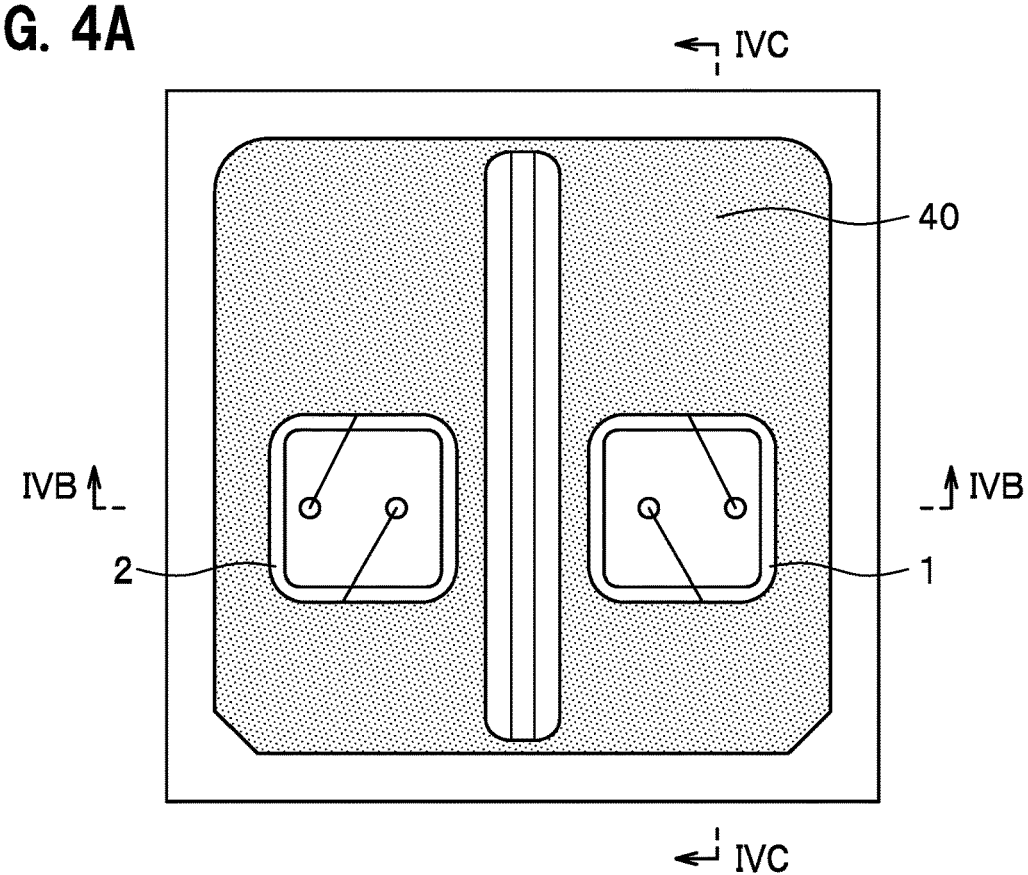
FIG. 4A is a plan view schematically showing an example of arrangement of a light reflecting member in a light-emitting device according to one embodiment.
Figure 4B:
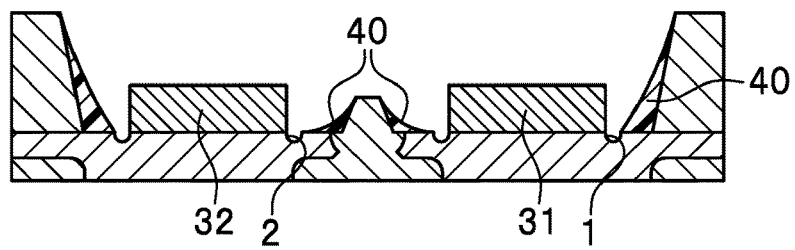
FIG. 4B is a schematic cross-sectional view taken along line IVB-IVB of FIG. 3A.
Figure 4C:
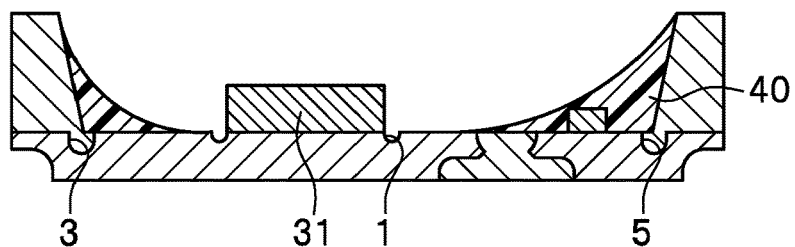
FIG. 4C is a schematic cross-sectional view taken along line IVC-IVC of FIG. 4A.
Figure 5A:
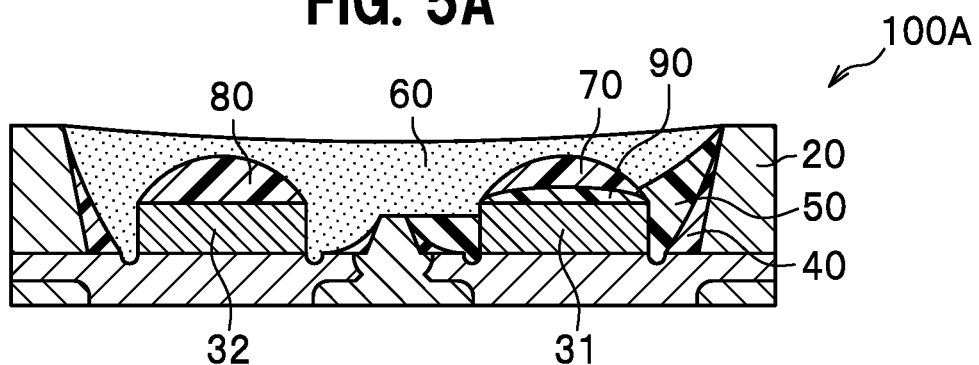
FIG. 5A is a cross-sectional view schematically showing an example of a configuration of a light-emitting device according to a first variational example.
Figure 5B:
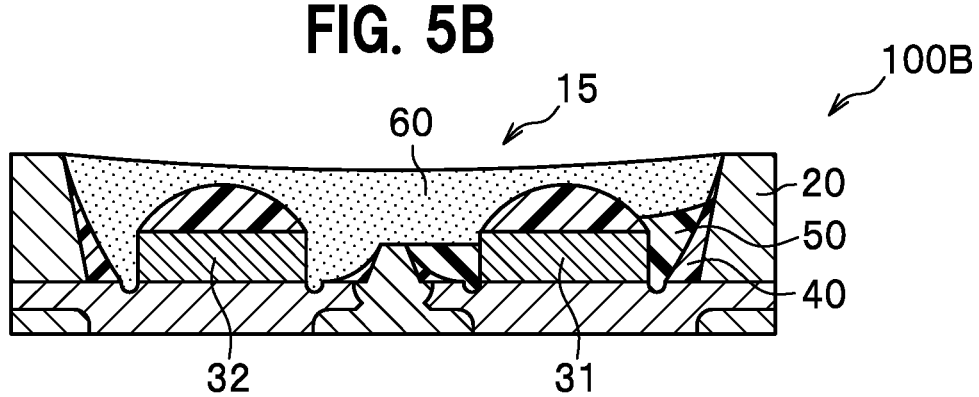
FIG. 5B is a cross-sectional view schematically showing an example of a configuration of a light-emitting device according to a second variational example.
Figure 5C:
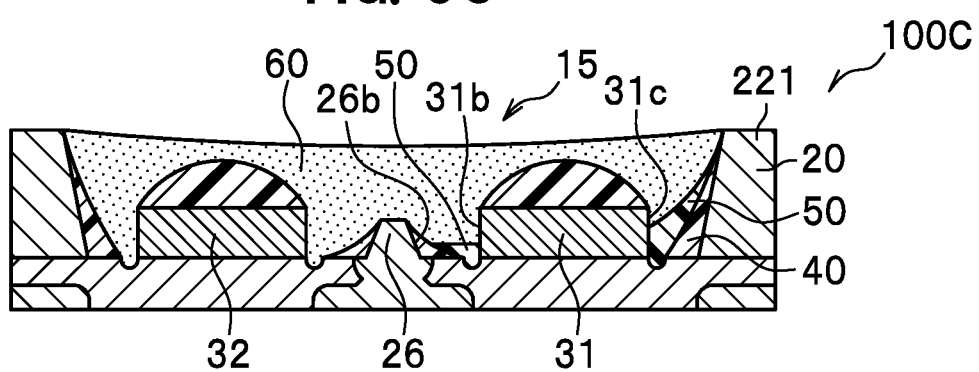
FIG. 5C is a cross-sectional view schematically showing an example of a configuration of a light-emitting device according to a third variational example.
Figure 5D:
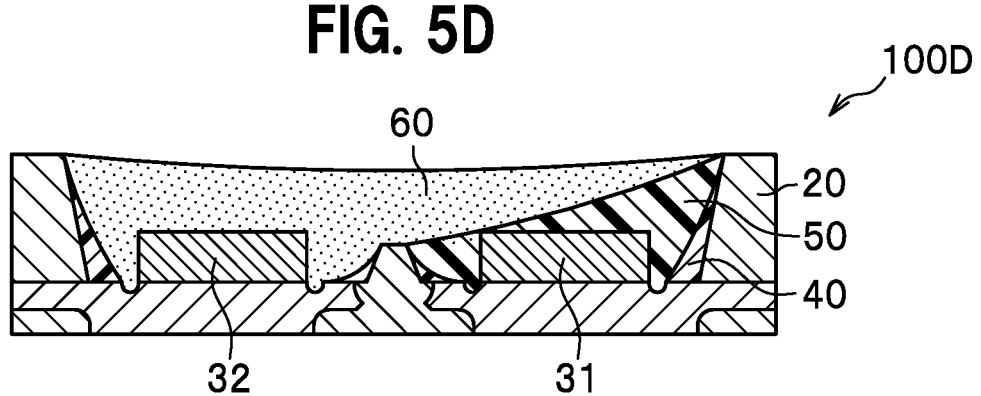
FIG. 5D is a cross-sectional view schematically showing an example of a configuration of a light-emitting device according to a fourth variational example.
Figure 5E:
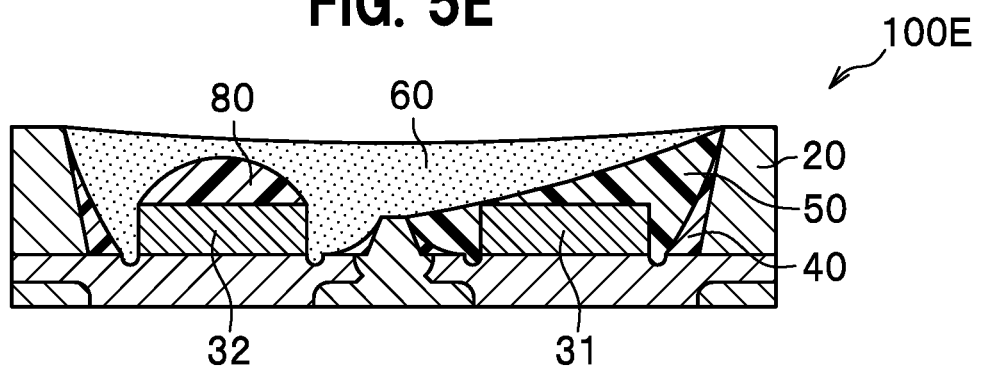
FIG. 5E is a cross-sectional view schematically showing an example of a configuration of a light-emitting device according to a fifth variational example.

Package 20 includes a lead frame 10 and a resin molded structure 21. The lead frame 10 is held by the resin molded structure 21. A recess 15 is formed in an upper surface of the package 20 to accommodate the light-emitting elements. As shown in FIG. 2B, the recess 15 according to the present embodiment is defined by a first lateral wall resin portion 221, a second lateral wall resin portion 222, a third lateral wall resin portion 223, and a fourth lateral wall resin portion 224. The first lateral wall resin portion 221 and the second lateral wall resin portion 222 extend in a first direction Y and are opposite to each other. The third lateral wall resin portion 223 and the fourth lateral wall resin portion 224 extend in a second direction X and are opposite to each other. In FIG. 2B, the first direction Y is in a Y-direction, and the second direction X is in an X-direction. The overall shape of the package 20 is, for example, an approximately rectangular parallelepiped shape. Upper surfaces of the lead frame 10 are exposed at the bottom surface of the recess 15 of the resin molded structure 21 of the package 20.

The lead frame 10 is electrically conductive and configured to serve as electrodes to supply electricity to the light-emitting elements. The lead frame 10 includes a first lead 11, a second lead 12, a third lead 13, and a fourth lead 14. The first lead 11, the second lead 12, the third lead 13, and the fourth lead 14, are disposed spaced apart from each other via a first bottom resin portion 24 and a second bottom resin portion 25 of the resin molded structure 21.

The first lead 11 is formed with a first groove 1 surrounding a first region 17 where the first light-emitting element 31 to be placed. The second lead 12 is formed with a second groove 2 surrounding a second region 18 where the second light-emitting element 32 to be placed. The first groove 1 and the second groove 2 are configured to prevent the light reflecting member 40 from contacting the first light-emitting element 31 and the second light-emitting element 32, respectively. In the present embodiment, the first groove 1 and the second groove 2 surround the first region 17 and the second region 18 in a rectangular ring shape in a plan view, respectively. The first groove 1 and the second groove 2 may surround the first region 17 and the second region respectively in a shape such as a circular shape, a quadrangular ring shape, a rectangular ring shape, a rhombic ring shape, polygonal ring shape, an elliptic ring shape, or other appropriate shape such as a shape that is a combination of these shapes. The first groove 1 and the second groove 2 may be formed in one continuous groove or by a plurality of intermittent grooves. Each of the first groove 1 and the second groove 2 may have a width approximately the same for the entire circumference, or may have a partially different width such as a partially widened width.

The first lead 11 is formed with a third groove 3. The second lead 12 is formed with a fourth groove 4. The third lead 13 is formed with a fifth groove 5. The fourth lead 14 is formed with a sixth groove 6. As shown in FIG. 2A and FIG. 2B, the third groove 3 is formed in the first lead 11 at a location corresponding to the third lateral wall resin portion 223, extending in the second direction X in a plan view. The fourth groove 4 is formed in the second lead 11 at a location corresponding to the third lateral wall resin portion 223, extending in the second direction X in a plan view. The fifth groove 5 is formed in the third lead 13 at a location corresponding to the fourth lateral wall resin portion 224, extending in the second direction X and then curved toward a side corresponding to the first lateral wall resin portion 221 in a plan view. The sixth groove 6 is formed in the fourth lead 14 at a location corresponding to the fourth lateral wall resin portion 224, extending in the second direction X and then curved toward a side corresponding to the second lateral wall resin portion 222 in a plan view.

The lead frame 10 can be formed using, for example, a metal such as copper, aluminum, gold, silver, iron, nickel, or an alloy of one or more of those metals, phosphor bronze, or iron copper, and can be formed in predetermined shapes using a technique such as rolling, punching, extruding, wet or dry etching, or a combination of such techniques. The lead frame 10 may have a single-layer structure or a multi-layer structure (for example, a cladding material). In particular, copper, which is inexpensive and has high heat dissipation performance, is preferably used. The lead frame 10 may also have a plating layer on the surface. For example, in order to improve reflectance, the plating layer may be made of gold, silver, copper, platinum, aluminum, or an alloy containing one of these types. Because gold is less corrosive than silver, the reliability of the light-emitting device 100 can be improved if the coating layer contains gold. When the plating layer contains silver, a protective layer made of silicon oxide or the like is preferably disposed on the surface of the plating layer. With the protective layer, discoloration of the layer that contains silver due to sulfur compounds in atmospheric air can be reduced or prevented. The protective layer can be disposed using a known technique such as sputtering in a vacuum.

The resin molded structure 21 includes a lateral resin portion 22 defining lateral surfaces of the recess 15, and a bottom resin portion 23 configured to hold the leads at the bottom surface of the recess 15.

The lateral resin portion 22 has inner lateral surfaces and outer lateral surfaces, and is the resin portion that forms the lateral walls of the package 20. The lateral resin portion 22 is the resin portion of the package 20 other than the bottom resin portion 23. The resin in the third groove 3, the fourth groove 4, the fifth groove 5, and the sixth groove 6, respectively, formed in the upper surfaces of the first lead 11, the second lead 12, the third lead 13, and the fourth lead 14 are also portions of the lateral resin portion 22 in the present embodiment.

The bottom resin portion 23 is the resin portion between the first lead 11 and the second lead 12, between the third lead 3 and the fourth lead 4, between the first lead 11 and the third lead 13, and between the second lead 12 and the fourth lead 14 at the bottom surface of the recess 15.

The inner lateral surfaces of the lateral resin portion 22 are formed by inclined surfaces such that the opening of the recess 15 widens from the bottom surface of the package 20 toward opening of the recess 15. The lateral resin portion 22 is disposed to fill the third groove 3, the fourth groove 4, the fifth groove 5, and the sixth groove 6. This improves the adhesion between the lateral resin portion 22 and the lead frame 10.

The lateral resin portion 22 includes a first lateral wall resin portion 221 and a second lateral wall resin portion 22 that are opposite to each other and extend in the first direction Y, and a third lateral wall resin portion 223 and a fourth lateral wall resin portion 224 that are opposite to each other and extend in the second direction X perpendicular to the first direction Y.

The bottom resin portion 23 includes a first bottom resin portion 24 configured to hold the first lead 11 and the second lead 12 that are spaced apart from each other and to hold the third lead 13 and the fourth lead 14 that are spaced apart from each other respectively with respect to the first bottom resin portion 24, and a second bottom resin portion 25 configured to hold the first lead 11 and the third lead 13 that are spaced apart from each other and the second lead 12 and the fourth lead 14 that are spaced apart from each other respectively with respect to the second bottom resin portion 25.

The first bottom resin portion 24 is located between the first light-emitting element 31 and the second light-emitting element 32, and between the first protective element 33 and the second protective element 34, in a plan view. The first bottom resin portion 24 is located at an approximately center of the package 20 in the second direction X and extends in the first direction Y in a plan view. The first bottom resin portion 24 is continuous from the third lateral wall resin portion 223 to the fourth lateral wall resin portion 224.

The second bottom resin portion 25 is located between the first light-emitting element 31 and the first protective element 33, and between the second light-emitting element 32 and the second protective element 34 in a plan view. The second bottom resin portion 25 is located near the fourth lateral wall resin portion 224 than to the third lateral wall resin portion 223 and extends in the second direction X in a plan view. The second bottom resin portion 25 is located continuously from the second lateral wall resin portion 222 to the first bottom surface resin part 24 and also continuously from the first bottom resin portion 24 to the first lateral wall resin portion 221.

In the present embodiment, the first bottom resin portion 24 includes a first flat portion 27 and a second flat portion 28 that are located at both sides of the wall portion 26. In the first bottom resin portion 24, portion from the lower surface to the upper surface of the lead frame 10 and the wall portion 26 extended upward from the upper surface of the lead frame 10 are integrally formed. The first flat portion 27 and the second flat portion 28 are located along both sides of the wall portion 26. The first flat portion 27 is located on the first lead 11 side and is flush with the upper surface of the first lead 11. The second flat portion 28 is located on the second lead 12 side and is flush with the upper surface of the second lead 12. The flat area of the bottom surface of the recess 15 of the package 20 is increased with the first flat portion 27 and the second flat portion 28 formed in the first bottom resin portion 24, which increases reflection of light at the bottom surface of the recess 15, thereby improving the light extraction efficiency. In the present specification, the term "flush with" allows a variation of ±15 µm.

The wall portion 26 is a member separating the first light-emitting element 31 and the second light-emitting element 32. The wall portion 26 may be formed integrally with the first bottom resin portion 24, or may be provided as a separate component. The wall portion 26 is located above the upper surfaces of the lead frame 10. The wall portion 26 may either cover or not cover the upper surface of the first lead 11 and/or the upper surface of the second lead 12. When the wall portion 26 covers the upper surface of the first lead 11 and/or the upper surface of the second lead 12, adhesion between the wall portion 26 and the first lead 11 and/or the second lead 12 can be improved. When the wall portion 26 does not cover the upper surface of the first lead 11 and/or the upper surface of the second lead 12, the area of the lead frame 10 exposed at the bottom surface of the recess 15 of the resin molded structure can be increased. This arrangement facilitates placing the first light-emitting element 31 and/or the second light-emitting element 32 on the lead frame 10. The wall portion 26 according to the present embodiment extends in the first direction Y and is continuously provided from the third lateral wall resin portion 223 to the fourth lateral wall resin portion 224. With the wall portion 26 provided in the light-emitting device 100, the first light-transmissive member 50 can be prevented from coming in contact with the second light-emitting element 32. Further, with the wall portion 26 provided in the light-emitting device 100, light emitted from the second light-emitting element 32 can be prevented from hitting the first light-transmissive member 50. The configuration described above can facilitate obtaining predetermined chromaticity in the light emitted from the light-emitting device 100. Moreover, the wall 26 in the light-emitting device 100 can increase the area of the first light-emitting element 31 covered by the first light-transmissive member 50.

In the present embodiment, the wall 26 has a trapezoidal shape in a cross-sectional view. The wall portion 26 has an upper surface 26a, which is the upper base of the trapezoidal shape, and lateral surfaces 26b, which are the legs of the trapezoidal shape. The wall portion 26 may have a shape different from that described above. For example, a square shape, a rectangular shape, a triangular shape, a semicircular shape, a semi-elliptical shape, or a shape having a curved upper portion may be employed, or a shape that has a step structure in a shape of a protrusion may be employed.

The wall portion 26 preferably has a height H lower than the height h of the first light-emitting element 31 and of the second light-emitting element 32. In other words, it is preferable that the upper surface 31a of the first light-emitting element 31 and the upper surface 32a of the second light-emitting element 32 are located higher than the upper surface 26a of the wall portion 26. This configuration can facilitate mixing of light emitted from the first light-emitting element 31 and light emitted from the second light-emitting element 32, and accordingly the color mixing is improved. In this case, the difference D between the height H of the wall portion 26 and the height h of the first and second emitting elements 31 and 32 is preferably in a range of 50 to 200 µm. The difference D of 50 µm or greater can facilitate improving the color mixing performance. Meanwhile, the difference D of 200 µm or less can facilitate the effect of having the wall portion 26 described above. In the present specification, the term "height" refers to a length in a height direction of a distal point with respect to the upper surface of the first lead 11 on which the first light-emitting element 31 is disposed. Also, the term "height direction" refers to a direction perpendicular to the upper surface of the first lead 11 on which the first light-emitting element 31 is disposed. For example, the height H of the wall portion 26 is the length between the upper surface of a portion of the first lead 11 where the first light-emitting element 31 is located and the upper surface 26a of the wall portion 26. The width W of the upper surface 26a of the wall portion 26 can be appropriately determined, but preferably in a range of 50 to 250 μm. When the width W of the upper surface of wall portion 26 is 50 μm or greater, the first light-transmissive member 50 can be prevented from spreading over the wall portion 26. Meanwhile, when the width W is 250 μm or less, the color mixing can be further facilitated. In the present specification, the term "width W of the upper surface 26a of the wall portion 26 refers to a greatest length of the upper surface 26a of the wall portion 26 in the direction (second direction X) perpendicular to the direction (first direction 1Y) in which the wall portion 26 extends.

For the resin molded structure 21, a known resin material such as a thermosetting resin, a thermoplastic resin, or the lime can be used as a base material. More specific examples of the thermoplastic resins include a polyphthalamide resin, a polybutylene terephthalate (PBT) resin, and an unsaturated polyester. More specific examples of the thermosetting resin include an epoxy resin, a silicone resin, and a modified silicone resin and so forth as an epoxy-modified silicone resin. In particular, a thermosetting resin such as an epoxy resin or a silicone resin having good heat-resisting properties and good light-resisting properties is preferably used as the resin material of the resin molded structure 8.

The resin molded structure 21 preferably contains a light-reflective material in the base resin material. It is preferable that the light-reflective material does not significantly absorb light from the light-emitting element and also has a large difference in the refractive index compared to that of the base resin material. Examples of the light-reflective material include titanium oxide, zinc oxide, silicon oxide, zirconium oxide, aluminum oxide, and aluminum nitride.

For the resin molded structure 21, a black color resin or a gray color resin may be used. Forming the resin molded body 21 using a black color resin or a gray color resin can reduce degradation of the light extraction efficiency even if the resin molded structure 21 is discolored. Examples of the black color resin and the gray color resin include carbon such as acetylene black, activated carbon, and carbon graphite, a transmission metal oxide such as iron oxide, manganese dioxide, cobalt oxide, molybdenum oxide, and a resin containing a filler such as a chromatic organic pigment. The density of colors such as black and gray can be adjusted according to the amount of filler added. Examples of the resin include the resin materials that are used for the base material of the resin molded structure 21 as described above.

First Light-Emitting Element and Second Light-Emitting Element

The first light-emitting element 31 and the second light-emitting element 32 are semiconductor elements configured to emit light when voltage is applied. The shape and size of the first and second light-emitting elements 31 and 32 can be appropriately determined. The first light-emitting element 31 and the second light-emitting element 32 can be blue light-emitting elements that emit light of blue color (a wavelength in a range of 430 to 490 nm). The emission color of the first light-emitting element 31 and the second light-emitting element 32 can be appropriately selected according to the application. For example, for the light-emitting element to emit blue light (wavelength in a range of 430 to 490 nm) or green light (wavelength in a range of 495 to 565 nm), a semiconductor element made of a nitride-based semiconductor ($In_XAl_YGa_{1-X-Y}N$, $0 \leq X$, $0 \leq Y$, $X+Y \leq 1$), GaP etc., can be used. For the emitting element to emit red light (emission wavelength in a range of 610 to 700 nm), GaAlAs, AlInGaP or the like can be used other than a nitride-based semiconductor.

The first light-emitting element 31 has a first and a second element electrodes on its upper surface and is mounted on the first Lead 11 in a face-up manner. In the present embodiment, the first element electrode of the first light-emitting element 31 is bonded to the first lead 11 via a wire, and the second element electrode is bonded to the third lead 13 via a wire. The second light-emitting element 32 has a first and a second element electrodes on its upper surface and is mounted on the second lead 12 in a face-up manner. In the present embodiment, the first element electrode of the second light-emitting element 32 is bonded to the second lead 12 via a wire, and the second element electrode is bonded to the fourth lead 14 via a wire.

First Protective Element and Second Protective Element

The first protective element 33 and the second protective element 34 are, for example, Zener diodes. The first protective element 33 and the second protective element 34 have element electrodes on their upper surfaces and are mounted on third lead 13 and fourth lead 14, respectively. In the present embodiment, the electrodes of the first protective element 33 and the second protective element 34 are bonded to the first lead 11 and the second lead 12 via the respective wires.

Light Reflecting Member

The light reflecting member 40 is configured to form a reflective surface within the recess 15 such that light from the first light-emitting element 31, the second light-emitting element 32, etc., can be efficiently guided upward to be extracted. Accordingly, the use of the reflective member 40 allows for an improvement in the light extraction efficiency of the light-emitting device 100.

It is preferable that the reflective member 40 covers the lead frame 10 and also covers the first flat portion 27 and the second flat portion 28. The configuration described above can facilitate reflection of light at the bottom surface of the recess 15 of the package 20, which further improves the light extraction efficiency. The adhesion between the light reflecting member 40 and the first bottom resin portion 24 can also be improved. In addition, it is preferable that a portion of wall 26, located between the first light-emitting element 31 and the second light-emitting element 32, of the reflective element 40, is exposed from the reflective member 40. For example, the upper surface of the wall portion 26 located between the first light-emitting element 31 and the second light-emitting element 32 is preferably exposed from the light reflecting member 40. With the configuration described above, the possibility of light from the first light-emitting element 31 and/or the second light-emitting element 32 being blocked by the wall portion 26 can be reduced, which allows for an improvement in mixing colors of light emitted from the light-emitting device 100. It is also preferable that the light reflecting member 40 is located spaced apart from the first light-emitting element 31 and the second light-emitting element 32 and covering the wall portion 26. The configuration described above facilitates extraction of light emitted from the first light-emitting element 31 and the second light-emitting element 32, which improves the light extraction efficiency of the light-emitting device 100. For example, the light reflecting member 40 preferably covers the entire lateral surfaces of the wall portion 26. The configuration described above can facilitate reflection of light at the bottom surface of the recess 15 of the package 20, which further improves the light extraction efficiency. The light reflecting member 40 preferably covers the first lateral wall resin portion 221, the second lateral wall resin portion 222, the third lateral wall resin portion 223, and the fourth lateral wall resin portion 224. This arrangement can facilitate reflection of light at the lateral surfaces of the recess 15 of the package 20, which can further improve the light extraction efficiency.

In one example illustrated in the present embodiment, the light reflecting member 40 continuously covers the lateral surfaces defining the recess 15 from their upper edge to the outer upper edge of the first groove 1 in a cross-sectional view. The light reflecting member 40 also continuously covers the lateral surfaces defining the recess 15 from their upper edge to the outer upper edge of the second groove 2 in a cross-sectional view. Further, the light reflecting member 40 covers the lateral surfaces of the wall portion 26 except for the upper surface of the wall portion 26.

It is preferable that the light reflecting member 40 absorbs or does not significantly transmit light from the light-emitting elements and external light. The light reflecting member 40 is preferably has a white color. For the base material of the light reflecting member 40, a resin material used for the resin molded body 21 can be used. In the light-reflecting member 40, a light-reflecting material in the base resin material. It is preferable that the light-reflective material does not significantly absorb light from the light-emitting element and also has a large difference in the refractive index compared to that of the base resin material. Examples of the light-reflective material include titanium oxide, zinc oxide, silicon oxide, zirconium oxide, aluminum oxide, and aluminum nitride.

First Light-Transmissive Member

The first light-transmissive member 50 is disposed in a region surrounded by the first lateral wall resin portion 221, the third lateral wall resin portion 223, and the fourth lateral wall resin portion 224. Partially via the light reflecting member 40, the first light-transmissive member 50 covers the first lead 11, the third lead 13, and the second bottom resin portion between the first lead 11 and the third lead 13. The first light-transmissive member 50 covers the lateral surfaces of the first light-emitting element 31 together with the first groove 1. The first light-transmissive member 50 covers the lateral surfaces defining the recess 15 of the package 20. The first light-transmissive member 50 may directly cover the lateral surfaces defining the recess 15, or when the light-emitting device has the light reflecting member 40, the first light-transmissive member 50 may cover the lateral surfaces defining the recess 15 via the light reflecting member 40. The first light-transmissive member 50 covers the first flat portion 27 via the light reflecting member 40 and the lateral surfaces of the wall portion 26 at the first lead 11 side and the third lead 13 side. The first light-transmissive member 50 may cover either the entire lateral surfaces or a portion of the lateral surfaces of the first emitting element 31.

The first light-transmissive member 50 contains the first wavelength converting member. For the first wavelength converting member, for example, a fluorescent material can be used. Examples of the fluorescent material include (Ca, Sr, Ba)$_5$(PO$_4$)$_3$(Cl, Br):Eu, (Sr, Ca, Ba)$_4$Al$_{14}$O$_{25}$:Eu, (Ca, Sr, Ba)$_8$MgSi$_4$O$_{16}$(F, Cl, Br)$_2$:Eu, (Y, Lu, Gd)$_3$(Al, Ga)$_5$O$_{12}$:Ce, (Sr, Ca)AlSiN$_3$:Eu, 3.5MgO·0.5MgF$_2$·GeO$_2$:Mn, (x-s)MgO·(s/2)Sc$_2$O$_3$·yMgF$_2$·uCaF$_2$·(1-t)GeO$_2$·(t/2)Mt$_2$O$_3$:zMn, Ca$_3$SC$_2$Si$_3$O$_{12}$:Ce, CaSc$_2$O$_4$:Ce, (La,Y)$_3$Si$_6$N$_{11}$:Ce, (Ca, Sr, Ba)$_3$Si$_6$O$_9$N$_4$:Eu, (Ca, Sr, Ba)$_3$Si$_6$O$_{12}$N$_2$:Eu, (Ba, Sr, Ca)SiO$_2$N$_2$:Eu, (Ca, Sr, Ba)$_2$Si$_5$N$_8$:Eu, (Ca, Sr, Ba)S:Eu, (Ba, Sr, Ca)Ga$_2$S$_4$:Eu, and K$_2$(Si, Ti, Ge)F$_6$:Mn.

For the first wavelength converting member, for example, a red fluorescent material having a wide half band width can be preferably employed. Accordingly, color rendering properties of the light-emitting device 100 can be improved. The red fluorescent material has a half value width of the emission spectrum, for example, in a range of 60 to 100 nm, preferably in a range of 70 to 85 nm. For example, a red fluorescent material having the composition represented by the formula (1) shown below can be used as the first wavelength converting member.

$$(Sr,Ca)AlSiN_3:Eu \tag{1}$$

By using a red phosphor having a composition expressed in the formula (1), the color rendering properties of the light-emitting device 100 can be improved while improving the light extraction efficiency of the light-emitting device 100.

The content of the first wavelength converting member can be, for example, in a range of 30 to 70 mass % with respect to the total mass of the first light-transmissive member 50.

The first wavelength converting member preferably has a peak emission wavelength longer than a peak emission wavelength of the second wavelength converting member to be described below. With this arrangement, the chromaticity coordinates of the light from the first light-transmissive member 50 and the light from the second light-transmissive member 60 on the 1931 CIE chart are such that the x-value of chromaticity coordinates of the light from the first light-transmissive member 50 is greater than the x-value of chromaticity coordinates of the light from the second light-transmissive member 60. This facilitates obtaining of light from the first light-transmissive member 50 and light from the second light-transmissive member 60 of different chromaticity coordinates. Further, the first wavelength converting member having a peak emission wavelength longer than that of the second wavelength converting member can reduce absorption of light from the first wavelength converting member by the second wavelength converting member.

For the first light-transmissive member 50, a base resin material the same or similar to that used for the resin molded structure 21 can be used. In particular, a silicone resin composition or an epoxy resin composition is preferably used. Further, light scattering particles of titanium oxide, silicon oxide, zirconium oxide, aluminum oxide or the like may be dispersed in the first light-transmissive member 50. The first light-transmissive member 50 may be formed of a ceramic, a glass or a sintered material of a fluorescent material, other than such a resin material. Accordingly, reliability of a high output power light-emitting device can be improved.

Second Light-Transmissive Member

The second light-transmissive member 60 is configured to cover the first light-emitting element 31, the second light-emitting element 32, and the first light-transmissive member 50 in a plan view. The second light-transmissive member 60 covers the first light-emitting element 31 via the third light-transmissive member 70. The second light-transmissive member 60 also covers the second light-emitting element 32 via the fourth light-transmissive member 80. The light-emitting elements etc., can be protected from external force, dust, moisture, etc., by the second light-transmissive member 60.

The second light-transmissive member 60 contains the second wavelength converting member. For the second wavelength converting member, a fluorescent material can be used, for example. The fluorescent material used for the first wavelength converting member can also be used for the second wavelength converting member. The second wavelength converting member may be a single fluorescent material or may include plural types of fluorescent materials. With the use of plural types of fluorescent materials for the second wavelength converting member, color rendering properties of the light-emitting device 100 can be improved. The fluorescent material(s) used for the first wavelength converting member can also be used for the second wavelength converting member. It is preferable to use a fluorescent material having a wide half band width for the second wavelength converting member. For example, $(Y, Lu, Gd)_3(Al, GA)_5O_{12}$:Ce can be preferably used, and a mixture of $(Y, Lu, Gd)_3(Al, Ga)_5O_{12}$:Ce and $(Sr, Ca) AlSiN_3$:Eu can be more preferably used. With this arrangement, a light-emitting device of high color rendering properties can be obtained.

For the second light-transmissive member 60, a base resin material the same or similar to that used for the resin molded structure 21 can be used. Further, light scattering particles as in the first light-transmissive member 50 can also be dispersed in the second light-transmissive member 60. The second light-transmissive member 60 may be formed of a ceramic, glass or a sintered material of a fluorescent material, other than such a resin material.

Third Light-Transmissive Member and Fourth Light-Transmissive Member

The third light-transmissive member 70 covers the upper surface of the first light-emitting element 31. The fourth light-transmissive member 80 covers the upper surface of side the second light-emitting element 32. It is preferable that the third light-transmissive member 70 contains the second wavelength converting member. It is desirable that the fourth light-transmissive member 80 does not contain any wavelength converting members. The third light-transmissive member 70 contains the third wavelength converting member, whereas the fourth light-transmissive member 80 does not contain any wavelength converting members, which facilitates obtaining different chromaticity in the light from the third light-transmissive member 70 and in the light from the fourth light-transmissive member 80. In the present specification, the expression "does not contain a wavelength converting member" does not exclude inevitable inclusion of a wavelength converting member, which is more specifically, a content of a wavelength converting member of 0.05 weight % or less.

Examples of the third wavelength converting member include a fluorescent material. The fluorescent material used for the third wavelength converting member can be the phosphor used for the first wavelength converting member.

The fluorescent material used for the third wavelength converting member is preferably a red fluorescent material configured to emit red light. The chromaticity of light on 1931ICE chromaticity diagram generally tends to have a greater x-value as an increase of red component in the light. Therefore, the use of a red fluorescent material as the third wavelength converting member can facilitate obtaining different chromaticity (in particular, the x-value) in the light from the third light-transmissive member 70 and in the light from the fourth light-transmissive member 80. For example, it is desirable to use a red fluorescent material having a wide half band width. Accordingly, color rendering properties of the light-emitting device 100 can be improved. For example, a wide half band width red fluorescent material can be the same red fluorescent material having a composition represented by the formula (1) illustrated for the first wavelength converting member.

The content of the third wavelength converting member can be, for example, in a range of 30 to 60% with respect to the total mass of the third light-transmissive member 70.

It is desirable that the peak emission wavelength of the third wavelength converting member is longer than the peak emission wavelength of the second wavelength converting member. Because the peak emission wavelength of the third wavelength converting member is longer than the peak emission wavelength of the second wavelength converting member, it is possible to reduce the proportion of light from the third wavelength converting member that is absorbed by the second wavelength converting member.

It is preferable that the first wavelength converting member and the third wavelength converting member are formed of fluorescent materials having a same composition. The use of the fluorescent materials having a same composition for the first wavelength converting member and the third wavelength converting member can facilitate adjustment of chromaticity of light from the first wavelength converting member 50 and the third wavelength converting member 70, which can facilitate mixing of the colors of light to efficiently obtain light of a predetermined color emitted from the light-emitting device 100.

It is preferable that the dominant wavelength of the light from the fourth light-transmissive member 80 is shorter than the dominant wavelength of the light from the first light-transmissive member 50. This arrangement can facilitate to obtain different chromaticity of light from the first light-transmissive member 50 and the light emitted from the fourth light-transmissive member 80. In the present specification, the wavelength of light reflected at a surface of the second light-transmissive member 60 and returned to the fourth light-transmissive member 80 side is not accounted for the dominant wavelengths of light from the fourth light-transmissive component 80 nor for the dominant wavelength of light from the first light-transmissive member 50.

The fourth light-transmissive member 80 preferably does not contain any wavelength converting members. For example, when a blue light-emitting element is used for the second light-emitting element 32 and when the fourth light-transmissive member 80 does not contain any wavelength converting members, most portion of light from the fourth light-transmissive member 80 is the light from the second light-emitting element 32 that has high blue component. Accordingly, light from the fourth light-transmissive component 80 has a chromaticity with a relatively small x-value, which facilitates obtaining different chromaticity in the light from the first light-transmissive member 50 and the light from the third light-transmissive member 70 than in the light from the fourth light-transmissive member 80.

Having the fourth light-transmissive member 80 disposed on the upper surface of the second light-emitting element 32 can reduce the amount of the second wavelength converting member located above the second light-emitting element 32. This reduces a ratio of light emitted from the second light-emitting element 32 in an upward direction and excited by the second wavelength converting member. Therefore, when the peak emission wavelength of the second wavelength converting member is longer than the peak wavelength of the second light-emitting element 32, the light emitted in an upward direction from the second light-emitting element 32 has a chromaticity with a relatively small x-value compared to light emitted from a light-emitting device that does not have the fourth light-transmissive member 80. As a result, the chromaticity of the light from the first light-transmissive member 50 and the light from the third light-transmissive member 70 and the chromaticity of the light from the fourth light-transmissive member 80 can be further easily different from the chromaticity of the emitted light from the fourth permeable member 80.

It is desirable that the third light-transmissive member 70 and the fourth light-transmissive member 80 respectively cover the upper surfaces of the first light-emitting element 31 and the second light-emitting element 32, and not cover lateral surfaces of the first light-emitting element 31 and the second light-emitting element 32, respectively. This arrangement can facilitate extraction of light from the lateral surfaces of the light-emitting elements and accordingly can improve extraction of light from the light-emitting device.

The third light-transmissive member 70 and the fourth light-transmissive member 80 can be formed in an appropriate shape. For example, the third light-transmissive component 70 is preferably disposed in a shape of a plano-convex lens in which a portion located corresponding to the center of the upper surface of the first light-emitting element 31 is located higher than a portion corresponding to a periphery of the upper surface of the first light-emitting element 31. Similarly, the fourth light-transmissive component 80 is preferably disposed in a shape of a plano-convex lens in which a portion located corresponding to the center of the upper surface of the second light-emitting element 32 is located higher than a portion corresponding to a periphery of the upper surface of the second light-emitting element 32. This arrangement can reduce or prevent light emitted from the first light-emitting element 31, etc., from being reflected on the surface of the third light-transmissive member 70 etc., and returning toward the first light-emitting element 31, etc. The third light-transmissive member 70 and the fourth light-transmissive member 80 may have an entire upper surface formed with a curved surface. This arrangement can reduce or prevent the light emitted from the light first light-emitting element 31, etc., from being reflected at the surface of the third light-transmissive member 70, etc.

The third light-transmissive member 70 and the fourth light-transmissive member 80 can have either the same height or different heights in the height direction. For example, in the height direction, the third light-transmissive member 70 can be higher than the fourth light-transmissive member 80. This allows for, for example, an increase in the content of the third wavelength converting member contained in the third light-transmissive component 70. Accordingly, the chromaticity of light from the third light-transmissive member 70 and the chromaticity of light from the fourth light-transmissive member 80 can be easily.

The resin material used for the resin molded structure 21 can also be used for the base member of the third light-transmissive member 70 and the fourth light-transmissive member 80. In particular, a silicone resin composition or an epoxy resin composition is preferably used. The light-scattering particles described in the first light-transmissive member 50 can be dispersed in the third light-transmissive member 70 and the fourth light-transmissive member 80. The resin material used for the base member of the third light-transmissive member 70 and the resin material used for the base member of the fourth light-transmissive member 80 can have different refractive indices. The third light-transmissive member 70 and the fourth light-transmissive member 80 may be formed from a ceramic, glass, or a sintered fluorescent material other than the resin materials.

Operation of Light-Emitting Device

In operation of the light-emitting device 100, electric current is supplied to the first light-emitting element 31 and the second light-emitting element 32 from an external power source via the lead frame 10, to cause the first light-emitting element 31 and the second light-emitting element 32 to emit light. The wavelength of a portion of the light from the first light-emitting element 31 is converted in the third light-transmissive member 70. The wavelength of a portion of the light whose wavelength have been converted in the third light-transmissive member 70 is converted in the second light-transmissive member 60 and discharged to the outside in an upward direction of the light-emitting device 100. A portion of the light from the first light-emitting element 31 traveling in a lateral direction is reflected at the light-reflecting member 40, and also is wavelength converted in the third light-transmissive member 50. A portion of the wavelength converted light from the first light-transmissive member 50 is then wavelength converted in the second light-transmissive member 60 and discharged to the outside in an upward direction of the light-emitting device 100. A portion of the light from the first light-emitting element 31 traveling downward is reflected at the first lead 11 and wavelength converted in the first light-transmissive member 50, the second light-transmissive member 60, and/or the third light-transmissive member 70, and discharged to the outside of the light-emitting device 100. A portion of the light from the second light-emitting element 32 traveling upward is transmitted through the fourth light-transmissive member 80 and wavelength converted in the second light-transmissive member 60 and discharged to the outside in an upward direction of the light-emitting device 100. A portion of the light from the second light-emitting element 32 traveling in a lateral direction is reflected at the light-reflecting member 40 and is wavelength converted in the second light-transmissive member 50, and discharged to the outside in an upward direction of the light-emitting device 100. A portion of the light from the second light-emitting element 32 traveling downward is reflected at the second lead 12 and wavelength converted in the second light-transmissive member 60, and discharged to the outside of the light-emitting device 100. In this case, because the light-emitting device 100 has the wall portion 26, the light from the second light-emitting element 32 can be prevented from hitting the first light-transmissive member 50, which facilitates obtaining light emission with a desired chromaticity.

Because light-emitting device 100 includes the first light-transmissive member 50 containing the first wavelength converting member and the second light-transmissive member 60 containing the second wavelength converting member, it is possible to emit light with a desired chromaticity by adjusting the type and quantity of the first wavelength converting member and the second wavelength converting member. This arrangement makes it possible to emit light of a wide range of chromaticity. Furthermore, the light-emitting device 100 includes the third light-transmissive member 70 containing the third wavelength converting member, which allows to emit light of further wider range of chromaticity by adjusting the type and quantity of the first wavelength converting member, the second wavelength converting member, and the third wavelength converting member. Furthermore, the light-emitting device 100 includes the fourth light-transmissive member 80 that allows to obtain different chromaticity between the light from the first light-transmissive member 50 and the third light-transmissive member 70 and the light from the fourth light-transmissive member 80, and accordingly, allows to emit light with further wider range of chromaticity.

Method of Manufacturing Light-Emitting Device

One example of a method of manufacturing an emitting device according to an embodiment will be described.

The method of manufacturing the light-emitting device 100 includes providing a lead frame, forming a resin molded structure, mounting light-emitting elements, disposing light-reflecting member, disposing a third light-transmissive member and the fourth light-transmissive member, disposing a first light-transmissive member, and disposing a second light-transmissive member. The materials and the positional relationship of the members are similar to those of the emitting device 100 described above and therefore the description thereof may be appropriately omitted.

Providing Lead Frame

In the step of providing a lead frame, a lead frame 10 including a first lead 11, a second lead 12, a third lead 13, and a fourth lead 14 are provided. In this step, a first groove 1 is formed in the first lead 11 to surround a first region 17 configured to mount the first light-emitting element 31, and a first groove 1 is formed in the second lead 12 to surround a second region 18 configured to mount the second light-emitting element 32. Also, a third groove 3, a fourth groove 4, a fifth groove 5, and a sixth groove 6 are formed in the first lead 11, the second lead 12, the third lead 13, and fourth lead 14, respectively. It is also possible to provide a lead frame 10 already formed with those grooves. Those grooves can be formed by etching or pressing, for example. When needed, a plating layer may be disposed on the surface(s) of the lead frame 10 by using electroless plating or electrolytic plating. The lead frame 10 may include a protective layer that covers the plating layer.

Forming Resin Molded Structure

In the step of forming resin molded structure, the resin molded structure 21 configured to securely hold each of the leads is formed. In this process, the lead frame 10 is placed in a mold for package, and a resin material is injected into the mold and hardened. The mold is configured to form a first bottom resin portion 24 that includes a wall portion 26 and a first flat portion 27 and a second flat portion 28 that are located at both sides of the wall portion 26. Accordingly, the packages 20 can be obtained.

Mounting Light-Emitting Element

In the step of mounting light-emitting elements, the first light-emitting element 31 is mounted on the first region 17 and the second light-emitting element 32 is mounted on the second region 18.

In this step, the first light-emitting element 31 and the second light-emitting element 32 are mounted on the bottom surface of the recess 15 in a face-up manner with the electrode forming surfaces as the main light-extracting surfaces and the surfaces at opposite side of the electrode forming surfaces are as the mounting surface. The first light-emitting element 31 is mounted on the first region 17 of the first lead 11 and the second light-emitting element 32 is mounted on the second region 18 of the second lead 12. In this step, a first protective element 33 and a second protective element 34 are mounted on the third lead 13 and the fourth lead 14, respectively.

Disposing Light Reflecting Member

In the step of disposing light-reflecting member, the light-reflecting member 40 is disposed on the bottom surface and inner lateral surfaces of the package defining the recess 15.

In this step, for example, by using potting technique, an uncured resin material is applied near an outer periphery of the bottom surface of the recess 15 (preferably at a boundary between the inner lateral surfaces and the bottom surface defining the recess 15). The uncured resin material is wet spread onto the inner lateral surfaces defining the recess 15 and covers the inner lateral surfaces defining the recess 15. In this case, the uncured resin material also flows onto the bottom surface defining the recess 15 and covers a portion of the bottom surface defining the recess 15. In the present embodiment, the viscosity, the quantity, and the location to apply the uncured resin material are preferably adjusted so that the resin material continuously covers the upper ends of the inner lateral surfaces defining the recess 15 to the outer upper edges of the first groove 1 and the second groove 1, and also covers lateral surfaces of the wall portion 26 and expose the upper surface of the wall portion 26. When the light reflecting member 40 is disposed by potting, the viscosity of the uncured resin material can be adjusted, for example, in a range of 1 to 50 Pa s at room temperature (20+/−5° C.). Subsequently, for example, the resin is cured under a temperature in a range of 120 to 200° C. to form the light-reflecting member 40.

Disposing Third Light-Transmissive Member and Fourth Light-Transmissive Member

In the step of disposing the third light-transmissive member and the fourth light-transmissive member, the third light-transmissive member 70 is disposed on the upper surface of the first light-emitting element 31 and the fourth light-transmissive member 80 is disposed on the upper surface of the second light-emitting element.

In this step, the resin material of the third light-transmissive member 70 is disposed on the upper surface of the first light-emitting element 31 by using printing, potting, spraying, or the like. Subsequently, the resin material is cured under a temperature in a range of 120 to 200° C. to form the third light-transmissive member 70. In a similar manner, the fourth light-transmissive member 80 is disposed on the upper surface of the second light-transmissive member 32. The third light-transmissive member 70 and the fourth light-transmissive member 80 may be disposed by attaching a sheet-shaped or a block-shaped resin member on the upper surface of the light-emitting element using an adhesive etc. When the third light-transmissive member 70 contains a third wavelength converting member, the third light-transmissive member may be disposed by using an electrophoresis deposition method etc.

In the step of disposing the third light-transmissive member and the fourth light-transmissive member, either the third light-transmissive member 70 or the fourth light-transmissive member 80 can be disposed first, or the both can be disposed simultaneously.

Disposing First Light-Transmissive Member

In the step of disposing the first light-transmissive member, the first light-transmissive member 50 is disposed to cover at least a portion of the lateral surfaces of the first light-emitting element 31.

In this step, the resin material of the first light-transmissive member 50 is disposed on the first lead 11, third lead 13, and a second bottom resin portion 25 located between the first lead 1 and the third lead 13 by potting, spraying, or the like. Also, the resin material of the first light-transmissive member 50 is disposed on the lateral surfaces of the recess 15 corresponding to the first lead 11 and the third lead 13. Subsequently, the resin material is cured under a temperature, for example, in a range of 120 to 200° C. to obtain the first light-transmissive member 50.

Disposing Second Light-Transmissive Member

In the step of disposing the second light-transmissive member, the second light-transmissive member 60 is disposed to cover the first light-emitting element 31, the second light-emitting element 32, and the first Light-transmissive member 50 in a plan view.

In this step, the resin material of the second light-transmissive member 60 is disposed in the recess 15, for example, by potting, spraying, or the like. Subsequently, the resin material is cured under a temperature in a range of 120 to 200° C. to form the second light-transmissive member 60.

In the method of manufacturing a light-emitting device may include one or more other steps between the steps or before or after a step, within a range without having an adverse effect on each step. For example, a step of removing foreign objects that have been entered during manufacture may be included.

Also, in the method of manufacturing a light-emitting device, any appropriate order of sequence of some steps may be employed or an inverse order of sequence may be employed in some steps. For example, the step of mounting the light-emitting elements may be carried out after the step of disposing the light-reflecting member. Further, the step of disposing the third light-transmissive member and the fourth light-transmissive member may be performed after the step of disposing the first light-transmissive member. The step of disposing the third light-transmissive member, the step of disposing the fourth light-transmissive member, and the step of disposing the first light-transmissive member can be performed in any appropriate order.

The step of providing the lead frame and/or the step of forming the resin molded structure can be carried out in-house, or can be carried out using a commercially available member(s) such as a lead frame provided with the grooves etc.

As shown in the above, a light-emitting device and a method of manufacturing a light-emitting device are illustrated semiconductor light-emitting element and a method of manufacturing the semiconductor light-emitting element are illustrated with the embodiments for carrying out the present invention, but the scope of the invention is not limited to the above description, and should be widely understood based on the scope of claim for patent. Further, various changes and modifications and so forth based on the description illustrated above are also within the scope of the invention.

Variational Examples

The light-emitting devices according to the variational examples illustrated below can also emit light with a wide range of chromaticity.

FIG. 5A to FIG. 5E are schematic cross-sectional views illustrating configurations of the light-emitting devices according to Variational Example 1 to Variational example 5, respectively.

Variational Example 1

The light-emitting device 100A includes a fifth light-transmissive member 90. The fifth light-transmissive member 90 covers the upper surface of the first light-emitting element 31, and the third light-transmissive member 70 covers the upper surface of the first light-emitting element 31 via the fifth light-transmissive member 90. The fifth light-transmissive member 90 is formed of a resin material that allows light to transmit therethrough, and does not include a wavelength converting member.

The fifth light-transmissive member 90 is configured to reflect returning light (for example, a portion of light from the wavelength converting member contained in the third light-transmissive member 70) toward the first light-emitting element 31 side to an upward direction at an interface between the fifth light 90 and the third light-transmissive member 70. This can reduce the possibility of a portion of the light from the first light-emitting element 31 returns to the first light-emitting element 31 and is absorbed by the first light-emitting element 31. As a result, the light extraction efficiency of the light-emitting device 100A can be improved.

The fifth light-transmissive member 90 preferably covers only the upper surface of the first light-emitting element 31. That is, the fifth light-transmissive member 90 preferably covers the upper surface of the first light-emitting element 31 but does not cover the lateral surfaces of the first light-emitting element 31. Accordingly, the first wavelength converting member in the first light-transmissive member 50 and/or the second wavelength converting member in the second light-transmissive member 60 is located on the lateral surfaces of the first light-emitting element 31. Accordingly, for example, when the first wavelength converting member and/or the second wavelength converting member is a high-excitation-efficiency fluorescent material, the first wavelength converting member and/or the second wavelength converting member can be efficiently excited by the light emitted in lateral directions from the first light-emitting element 3. As a result, the light-emitting device of good light extraction efficiency can be obtained.

The fifth light 90 preferably covers 50% or greater area of the upper surface of the first light-emitting element 31, more preferably covers the entire of the upper surface of the first light-emitting element 31. Accordingly, the fifth light-transmissive member 90 covers most of the upper surface of the first light-emitting element 31, such that light returning to the first light-emitting element 31 can be efficiently reflected at the upper surface of the fifth light 90.

The fifth light 90 preferably has minute unevenness on its upper surface. With this, adhesiveness between the fifth light-transmissive member 90 and the third light-transmissive member 70 can be improved. The minute unevenness can be formed, for example, by applying a roughness treatment to the upper surface of the fifth light-transmissive member 90. Examples of the roughness treatment include plasma processing, etching, blasting, and adhering microparticles.

For the base member of the fifth light-transmissive member 90, a resin material similar to the resin material used for the resin molded structure 21 can be used. The fifth light-transmissive member 90 can contain light scattering particles illustrated in the first light-transmissive member 50. The fifth light-transmissive member 90 can be disposed on the upper surface of the first light-emitting element 31 in a similar manner as in the third light-transmissive member 70.

Variational Example 2

In the light-emitting device 100B, the first light-transmissive member 50 covers a portion of the inner lateral surfaces of the package 20 that defining the recess 15. More specifically, the first light-transmissive member 50 covers lower portions of the inner lateral surfaces defining the recess 15 via the light-reflecting member 40. The upper portions of the inner lateral surfaces defining the recess 15 are exposed from the first light-transmissive member 50. According to the configuration described above, the volume of the second light-transmissive member 60 can be increased compared to a case in which the first light-transmissive member 50 covers to the upper edges of the inner lateral surfaces defining the recess 15. This can facilitate a reduction of luminance unevenness of light from the second light-transmissive member 60. Other configurations are similar to those of the light-emitting device 100.

Variational Example 3

In the light-emitting device 100C, the first light-transmissive member 50 covers portions of the lateral surfaces of the first light-emitting element 31, and also the first light-transmissive member 50 covers portions of the wall portion 26. More specifically, the first light-transmissive member 50 covers, via the light-reflecting member 40, the lateral surface 26b that facing the lateral surface 31b of the first light-emitting element 31. The upper surface of the wall portion 26 is exposed from the first light-transmissive member 50. The first light-transmissive member 50 covers a portion of the lateral surface 31c of the first light transmitting element 31 that facing the first lateral wall resin portion 221. The lower portion of the lateral surface 31c of the first light-emitting element 31 is covered by the first light-transmissive member 50, and the upper portion of the lateral surface 31c of the first light-emitting element 31 is exposed from the first light-transmissive member 50. In a similar manner as of the lateral surface 31c of the first light-emitting element 31, the first light-transmissive member 50 may be disposed with a height to expose the upper portion of each of the lateral surfaces of the lateral surface of the first light-emitting element 31 that facing the third lateral wall resin portion 223, and the lateral surface of the first light-emitting element 31 that facing the fourth lateral wall resin portion 224. According to the configurations described above, the volume of the second light-transmissive member 60 can be increased compared to a case in which the first light-transmissive member 50 covers the entire portion of the lateral surface 26b of wall portion 26 and the entire portion of the lateral surface 31c of the first light-emitting element 31. This can facilitate a reduction of luminance unevenness of light from the second light-transmissive member 60. Other configurations are similar to those of the light-emitting device 100.

Variational Example 4

The light-emitting device 100D does not include the third light-transmissive member 70 and the fourth light-transmissive member 80. The first light-transmissive member 50 covers the upper surface of the first light-emitting element 31 and also covers the lateral surfaces of the first light-emitting element 31. More specifically, the first light-transmissive member 50 covers the entire portion of the upper surface and the entire portions of the lateral surfaces of the first light-emitting element 31. The second light-transmissive member 60 covers the first light-emitting element 31 via the first light-transmissive member 50. With this configuration, the light-emitting device 100D allows for reducing the number of the steps in and thus facilitates the manufacturing. Other configurations are similar to those of the light-emitting device 100.

Variational Example 5

The light-emitting device 100E does not include the third light-transmissive member 70. Also, the first light-transmissive member 50 covers the entire portion of the upper surface and the entire portion of the lateral surfaces of the first light-emitting element 31. According to this configuration, the light-emitting device 100E is easy to be manufactured and has the effect achieved by having the fourth light-transmissive member 80. Other configurations are similar to those of the light-emitting device 100.

The light-emitting device may be such that, for example, in the form of the light-emitting device 100E, the first light-transmissive member 50 may cover a portion of the upper surface of the first light-emitting element 31, or the first light-transmissive member 50 may not cover the entire portion of the upper surface of the first light-emitting element 31.

The light-emitting device may be such that, for example, in the form of the light-emitting device 100E, the first light-transmissive member 50 does not cover the upper surface of the first light-emitting element 31 and covers portions of the lateral surfaces of the first light-emitting element 31 as in the light-emitting device 100C.

The light-emitting device may include the third light-transmissive member 70 and does not include the fourth light-transmissive member 80.

The light-emitting device may be provided with the first light-transmissive member 50 with an appropriately adjusted amount and/or with the third light-transmissive member 70 and/or the fourth light-transmissive member 80 whose presence or absence, and so forth are appropriately adjusted.

The light transmitting device illustrated above includes a package 20 formed with a recess of 15, and the light-emitting elements are mounted on the bottom surface in the recess 15, but the light-emitting device may include a planar substrate on which the light-emitting elements are mounted. The first light-emitting element 31 and the second light-emitting element 32 may be mounted in a flip-chip manner.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:
1. A light-emitting device comprising:
a first light-emitting element and a second light-emitting element, each configured to be independently driven;
a first lead on which the first light-emitting element is mounted;
a second lead on which the second light-emitting element is mounted;
a resin portion comprising a wall portion located between the first light-emitting element and the second light-emitting element, a first flat portion, and a second flat portion, the resin portion supporting the first lead and the second lead;
a first light-transmissive member separated from the second light-emitting element by the wall portion and covering at least a portion of lateral surfaces of the first light-emitting element, wherein the first light-transmissive member contains a first wavelength converting member;
a second light-transmissive member covering the first light-emitting element, the second light-emitting element, and the first light-transmissive member in a plan view, wherein the second light-transmissive member contains a second wavelength converting member; and a light reflecting member spaced apart from the first light-emitting element and the second light-emitting element and covering the wall portion; wherein;
a peak emission wavelength of the first wavelength converting member is longer than a peak emission wavelength of the second wavelength converting member;
in a plan view:
  the wall portion is located between the first flat portion and the second flat portion,
  the first flat portion is located closer to the first lead than the second lead and is flush with an upper surface of the first lead, and
  the second flat portion is located closer to the second lead than the first lead and is flush with an upper surface of the second lead; and
the light reflecting member covers the first lead, the second lead, the first flat portion, and the second flat portion.

2. The light-emitting device according to claim 1, wherein the first light-transmissive member covers an upper surface and lateral surfaces of the first light-emitting element, and the second light-transmissive member covers the first light-emitting element via the first light-transmissive member.

3. The light-emitting device according to claim 1, further comprising:
a fourth light-transmissive member covering an upper surface of the second light-emitting element;
wherein the second light-transmissive member covers the second light-emitting element via the fourth light-transmissive member; and
wherein a dominant wavelength of light from the fourth light-transmissive member is shorter than a dominant wavelength of light from the first light-transmissive member.

4. The light-emitting device according to claim 3, wherein the fourth light-transmissive member does not contain a wavelength converting member.

5. The light-emitting device according to claim 3, wherein the fourth light-transmissive member has a shape in which a portion located at a center of an upper surface of the second light-emitting element is higher than a portion located at a peripheral portion of the upper surface of the second light-emitting element.

6. The light-emitting device according to claim 1, wherein a height of the wall portion is less than heights of the first light-emitting element and the second light-emitting element.

7. The light-emitting device according to claim 1, further comprising a light reflecting member spaced apart from the first light-emitting element and the second light-emitting element and covering the wall portion.

8. The light-emitting device according to claim 7, wherein a portion of the wall portion located between the first light-emitting element and the second light-emitting element is exposed from the light reflecting member.

9. The light-emitting device according to claim 1, wherein:
the resin portion further comprises a lateral resin portion;
the first light-emitting element is located between the wall portion and the lateral resin portion; and
in a cross-sectional view, a maximum height of a portion of the first light-transmissive member located between the wall portion and the first light-emitting element is less than a maximum height of a portion of the first light-transmissive member located between the lateral resin portion and the first light-emitting element.

10. A light-emitting device comprising:
a first light-emitting element and a second light-emitting element, each configured to be independently driven;
a wall portion located between the first light-emitting element and the second light-emitting element;
a first light-transmissive member separated from the second light-emitting element by the wall portion and covering at least a portion of lateral surfaces of the first light-emitting element, wherein the first light-transmissive member contains a first wavelength converting member;
a second light-transmissive member covering the first light-emitting element, the second light-emitting element, and the first light-transmissive member in a plan view, wherein the second light-transmissive member contains a second wavelength converting member; and
a third light-transmissive member covering an upper surface of the first light-emitting element, wherein the third light-transmissive member contains a third wavelength converting member; wherein:
  a peak emission wavelength of the first wavelength converting member is longer than a peak emission wavelength of the second wavelength converting member;
  a peak emission wavelength of the third wavelength converting member is longer than the peak emission wavelength of the second wavelength converting member;
  the second light-transmissive member covers the first light-emitting element via the third light-transmissive member; and
  the first wavelength converting member and the third wavelength converting member are formed of fluorescent materials having the same composition.

11. The light-emitting device according to claim 10, further comprising:
a fourth light-transmissive member covering an upper surface of the second light-emitting element; wherein:
the second light-transmissive member covers the second light-emitting element via the fourth light-transmissive member; and
a dominant wavelength of light from the fourth light-transmissive member is shorter than a dominant wavelength of light from the first light-transmissive member.

12. The light-emitting device according to claim 11, wherein the fourth light-transmissive member does not contain a wavelength converting member.

13. The light-emitting device according to claim 11, wherein the fourth light-transmissive member has a shape in which a portion located at a center of an upper surface of the second light-emitting element is higher than a portion located at a peripheral portion of the upper surface of the second light-emitting element.

14. The light-emitting device according to claim 10, wherein a height of the wall portion is less than heights of the first light-emitting element and the second light-emitting element.

15. The light-emitting device according to claim 10, further comprising a light reflecting member spaced apart from the first light-emitting element and the second light-emitting element and covering the wall portion.

16. The light-emitting device according to claim 15, wherein a portion of the wall portion located between the first light-emitting element and the second light-emitting element is exposed from the light reflecting member.

17. The light-emitting device according to claim 10, further comprising:
- a resin portion comprising the wall portion and a lateral resin portion; wherein:
- the first light-emitting element is located between the wall portion and the lateral resin portion,
- in a cross-sectional view, a maximum height of a portion of the first light-transmissive member located between the wall portion and the first light-emitting element is less than a maximum height of a portion of the first light-transmissive member located between the lateral resin portion and the first light-emitting element.

18. A light-emitting device comprising:
- a first light-emitting element and a second light-emitting element, each configured to be independently driven;
- a wall portion located between the first light-emitting element and the second light-emitting element;
- a first light-transmissive member separated from the second light-emitting element by the wall portion and covering at least a portion of lateral surfaces of the first light-emitting element, wherein the first light-transmissive member contains a first wavelength converting member;
- a second light-transmissive member covering the first light-emitting element, the second light-emitting element, and the first light-transmissive member in a plan view, wherein the second light-transmissive member contains a second wavelength converting member;
- a third light-transmissive member covering an upper surface of the first light-emitting element, wherein the third light-transmissive member contains a third wavelength converting member; and
- a fifth light-transmissive member covering an upper surface of the first light-emitting element, wherein the fifth light-transmissive member does not contain a wavelength converting member; wherein:
- a peak emission wavelength of the first wavelength converting member is longer than a peak emission wavelength of the second wavelength converting member;
- a peak emission wavelength of the third wavelength converting member is longer than the peak emission wavelength of the second wavelength converting member;
- the second light-transmissive member covers the first light-emitting element via the third light-transmissive member; and
- the third light transmissive member covers the upper surface of the first light-emitting element via the fifth light-transmissive member.

19. The light-emitting device according to claim 18, further comprising:
- a resin portion comprising the wall portion and a lateral resin portion; wherein:
- the first light-emitting element is located between the wall portion and the lateral resin portion; and
- in a cross-sectional view, a maximum height of a portion of the first light-transmissive member located between the wall portion and the first light-emitting element is less than a maximum height of a portion of the first light-transmissive member located between the lateral resin portion and the first light-emitting element.

20. The light-emitting device according to claim 18, further comprising a light reflecting member spaced apart from the first light-emitting element and the second light-emitting element and covering the wall portion.

* * * * *